United States Patent
Yoo et al.

(10) Patent No.: US 8,796,540 B2
(45) Date of Patent: Aug. 5, 2014

(54) METHOD OF MANUFACTURING SUBSTRATE FOR PHOTOVOLTAIC CELL

(75) Inventors: YoungZo Yoo, ChungCheongNam-Do (KR); SeoHyun Kim, ChungCheongNam-Do (KR); Gun Sang Yoon, ChungCheongNam-Do (KR)

(73) Assignee: Samsung Corning Precision Materials Co., Ltd. (KR)

( * ) Notice: Subject to any disclaimer, the term of this patent is extended or adjusted under 35 U.S.C. 154(b) by 114 days.

(21) Appl. No.: 13/449,678

(22) Filed: Apr. 18, 2012

(65) Prior Publication Data

US 2012/0266952 A1   Oct. 25, 2012

(30) Foreign Application Priority Data

Apr. 22, 2011  (KR) .................. 10-2011-0037891

(51) Int. Cl.
*H01L 31/18* (2006.01)

(52) U.S. Cl.
USPC .............................. 136/256; 136/201; 438/85

(58) Field of Classification Search
USPC ......... 136/201, 205, 206, 244, 252, 256, 258, 136/261, 262, 265
See application file for complete search history.

(56) References Cited

U.S. PATENT DOCUMENTS

| | | | |
|---|---|---|---|
| 4,285,762 A * | 8/1981 | Moustakas | 438/719 |
| 6,331,672 B1 | 12/2001 | Matsuda et al. | |
| 2008/0041526 A1 * | 2/2008 | Pass | 156/345.31 |
| 2008/0096376 A1 * | 4/2008 | Li et al. | 438/597 |
| 2009/0255578 A1 * | 10/2009 | Eaglesham et al. | 136/256 |
| 2009/0308449 A1 | 12/2009 | Kim et al. | |
| 2010/0126575 A1 | 5/2010 | Bailat et al. | |
| 2010/0311228 A1 * | 12/2010 | Komin et al. | 438/478 |
| 2011/0163448 A1 | 7/2011 | Kuchiyama et al. | |

FOREIGN PATENT DOCUMENTS

| | | |
|---|---|---|
| EP | 1686595 A1 | 8/2006 |
| KR | 20060003277 A | 1/2006 |
| WO | 2010026899 A1 | 3/2010 |

OTHER PUBLICATIONS

Wang et al. "Influence of hydrogen plasma treatment of Al-doped ZnO thin films for amorphous silicon thin film solar cells" Current Applied Physics 11 (2011) S12-S16.*
Addonizio et al., "Surface morphology and light scattering properties of plasma etched ZnO:B films grown by LP-MOCVD for silicon thin film solar cells", Thin Solid Films (2009) 1026-1031.
Bailat et al., "High-efficiency P-I-N microcrystalline and micromorph thin film silicon solar cells deposited on LPCVD ZnO coated glass substrates", pp. 1533-1536, Copyright 2006 IEEE.

* cited by examiner

*Primary Examiner* — Susan D Leong
(74) *Attorney, Agent, or Firm* — Lerner, David, Littenberg, Krumholz & Mentlik, LLP

(57) ABSTRACT

A method of manufacturing a substrate for a photovoltaic cell, in which the high optical characteristic in a long-wavelength range available for the photovoltaic cell can be maintained, and at the same time, the amount of hazing can be increased. The method includes the step of forming a zinc oxide (ZnO) thin film layer doped with a dopant on a transparent substrate, and the step of controlling the surface structure of the zinc oxide thin film layer by etching the zinc oxide thin film layer using hydrogen plasma.

10 Claims, 4 Drawing Sheets

METHOD OF MANUFACTURING SUBSTRATE FOR PHOTOVOLTAIC CELL

CROSS REFERENCE TO RELATED APPLICATION

The present application claims priority from Korean Patent Application Number 10-2011-0037891 filed on Apr. 22, 2011, the entire contents of which application are incorporated herein for all purposes by this reference.

BACKGROUND OF THE INVENTION

1. Field of the Invention

The present invention relates to a method of manufacturing a substrate for a photovoltaic cell, and more particularly, to a method of manufacturing a substrate for a photovoltaic cell, in which the high optical characteristic in a long-wavelength range available for the photovoltaic cell can be maintained, and at the same time, the amount of hazing can be increased.

2. Description of Related Art

Recently, as a measure against the shortage of energy resources and environmental pollution, the development of photovoltaic cells is underway on a large scale. A photovoltaic cell is a key device for photovoltaic power generation that directly converts solar energy into electric energy. Photovoltaic cells are currently being applied in a variety of fields, including the supply of electricity to electrical and electronic products, houses and buildings as well as industrial power generation. The most basic structure of such photovoltaic cells is a P-N junction diode. Photovoltaic cells are divided into a variety of types, for example, a silicon (Si) photovoltaic cell, a chemical photovoltaic cell, a dye-sensitized photovoltaic cell, and a tandem photovoltaic cell, depending on the material used in the light-absorbing layer. Specifically, the Si photovoltaic cell uses Si for the light-absorbing layer, and the chemical photovoltaic cell uses $CuInSe_2$ (CIS) or cadmium telluride (CdTe) for the light-absorbing layer. In the dye-sensitized photovoltaic cell, photosensitive dye molecules are adsorbed on the surface of nano particles of a porous film, and electrons are activated when the photosensitive dye molecules absorb visible light. The tandem photovoltaic cell has a plurality of amorphous Si layers stacked on one another. In addition, photovoltaic cells are also divided into bulk type photovoltaic cells (including single crystalline and polycrystalline types) and thin film type photovoltaic cells (including amorphous and microcrystalline types).

At present, bulk type photovoltaic cells using polycrystalline Si occupy 90% or more of the entire market. However, the bulk type crystalline Si photovoltaic cell has a problem in that the unit cost for photovoltaic power generation is expensive, i.e. 3 to 10 times as great as the cost of thermal power generation, atomic power generation, hydraulic power generation, or the like. This is because the bulk type crystalline Si photovoltaic cell uses a large amount of Si as a raw material, which is expensive, and because the complicated manufacturing process increases the cost of manufacture.

In order to solve such problems, recently, thin film photovoltaic cells using amorphous Si (a-Si: H) and microcrystalline Si (mc-Si: H) are being developed and commercially distributed.

In the meantime, a transparent conductive film (typically, a TCO film) used in photovoltaic cells is required to exhibit high light transmittance, high conductivity, and a high light-trapping effect. In particular, a tandem type thin film photovoltaic cell (see FIG. 7) is required to have high light transmittance and a high haze value in a wide wavelength band ranging from 350 nm to 1200 nm. In addition, when the light-absorbing layer is formed in the transparent conductive film, resistance to hydrogen plasma is also required.

The transparent conductive film that is most widely used for photovoltaic cells at present is a conductive film that contains tin oxide ($SnO_2$) as the major component. However, the $SnO_2$ transparent conductive film has limitations due to its material properties. That is, it exhibits a low light transmittance in a long-wavelength range of 900 nm or more, which leads to low photoelectric transformation efficiency of photovoltaic cells. It also has a low electrical conductivity and a low transmittance of about 70%. In addition, the $SnO_2$ transparent conductive film suffers from an increase in resistance and a decrease in transmission characteristic because its surface is damaged by the formation of a large amount of hydrogen plasma when p-type Si is deposited during the processing of photovoltaic cells.

In addition, indium tin oxide (ITO), which is used for the transparent conductive film together with $SnO_2$, satisfies the requirements for high light transmittance of 80% or higher and an excellent electrical conductivity of $10^{-4}$ Ωcm. However, ITO also has problems in that the price of the rare raw material In, which is used as the major component, is continuously increasing, and in that In exhibits a high reduction rate in the hydrogen plasma processing and resultant chemical instability.

In order to solve such problems, the development of a transparent conductive film that can replace the transparent conductive films having $SnO_2$ or In as the major component thereof is underway. Recently, there has been strong interest in zinc oxide (ZnO) as the ideal material. ZnO has an advantage in that its electro-optical properties are readily adjustable depending on the doping material, since it can be easily added and has a narrow conduction band. In addition, a transparent conductive film having ZnO as the major component is stable in hydrogen plasma processing, is manufactured at a low cost, and has high light transmittance.

Such a ZnO transparent conductive film is manufactured by chemical vapor deposition (CVD). However, the surface of the ZnO transparent conductive film, which is manufactured by CVD, is configured such that it has very sharp grooves. This sharp groove structure, however, acts as a source for defects during the deposition of amorphous Si, ultimately becoming a cause of decreased efficiency of the photovoltaic cell to which the ZnO transparent conductive film is applied.

The transparent conductive film used as the transparent electrode of a photovoltaic cell is required to exhibit high transmittance, high conductivity, and a high haze value. However, the ZnO transparent conductive film has the problem of structural defects caused by the groove structure in the surface, as mentioned above, despite the increase in hazing attributable to the groove structure.

The information disclosed in this Background of the Invention section is only for the enhancement of understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a method of manufacturing a substrate for a photovoltaic cell, in which a high optical characteristic in a long-wavelength range available for the photovoltaic cell can be maintained and, at the same time, the value of hazing can be increased.

In an aspect of the present invention, provided is a method of manufacturing a substrate for a photovoltaic cell. The method includes the steps of: forming a zinc oxide (ZnO) thin film layer doped with a dopant on a transparent substrate, and controlling the surface structure of the zinc oxide thin film layer by etching the zinc oxide thin film layer using hydrogen plasma.

In an embodiment, the hydrogen plasma may selectively etch the (11-20) plane of the ZnO thin film layer.

In an embodiment, the etching the ZnO thin film layer using the hydrogen plasma may be carried out at a temperature ranging from room temperature to 300° C. for 1 to 30 minutes.

In an embodiment, the hydrogen plasma may dope the ZnO thin film layer with hydrogen.

In an embodiment, the hydrogen plasma may form a hydrogen passivation film on the ZnO thin film layer.

In an embodiment, the ZnO thin film layer may be formed via chemical vapor deposition (CVD).

In an embodiment, the dopant may be one or a combination of at least two selected from a group of candidate substances consisting of gallium, aluminum, boron, indium, silicon and titanium.

Here, the dopant may be added in an amount ranging from $1 \times 10^{18}/cm^3$ to $5 \times 10^{22}/cm^3$.

In addition, the dopant may be added in an amount ranging from 0.1 wt % to 0.5 wt %.

In an embodiment, the step of controlling the surface structure of the ZnO thin film layer may be carried out in a vacuum chamber, the pressure in the vacuum chamber being maintained at $1 \times 10^{-4}$ torr or less.

In an embodiment, the intensity of the hydrogen plasma may be adjusted by the application of radio-frequency power in a range from 10 W to 800 W.

In an embodiment, the method may further include the step of, after the controlling the surface structure of the ZnO thin film layer is completed, forming a light-absorbing layer on the ZnO thin film layer.

In another aspect of the present invention, also provided is a substrate for a photovoltaic cell. The substrate includes a transparent substrate and a ZnO thin film layer formed on the transparent substrate, the ZnO thin film layer being doped with a dopant. The (11-20) plane of the ZnO thin film layer is selectively etched by hydrogen plasma, and the ZnO thin film layer is doped with hydrogen due to the hydrogen plasma, so that a hydrogen passivation film is formed thereon.

According to embodiments of the invention, it is possible to maintain a high optical characteristic in a long-wavelength range of 800 nm or more, which is available for the photovoltaic cell, while increasing the value of hazing.

Furthermore, it is possible to control the surface structure of ZnO by processing it using hydrogen plasma, thereby preventing defects from occurring during the growth of an amorphous Si layer and eventually improving the efficiency of the photovoltaic cell to which the substrate is applied.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Hereinafter, the method of manufacturing a substrate for a photovoltaic cell of the invention will be described more fully with reference to the accompanying drawings, in which exemplary embodiments thereof are shown.

In the following description of the present invention, detailed descriptions of known functions and components incorporated herein will be omitted when they may make the subject matter of the present invention unclear.

The method of manufacturing a substrate for a photovoltaic cell according to an embodiment of the invention is a method of manufacturing the substrate for the photovoltaic cell, which uses zinc oxide (ZnO) as a transparent electrode, and includes the step of forming a ZnO thin film layer and the step of controlling the surface structure of the ZnO thin film layer.

First, the step of forming the ZnO thin film layer is the step of forming the ZnO thin film layer doped with a dopant on a transparent substrate. In this step, the ZnO thin film layer doped with the dopant is formed on the transparent substrate by chemical vapor deposition (CVD).

The transparent substrate may be selected from any transparent substrates, as long as they have excellent light transmittance and excellent mechanical properties. For example, the transparent substrate can be made of a polymeric material, such as a thermally curable organic film or an ultraviolet (UV)-curable organic film, or chemically tempered glass, such as sodalime ($SiO_2$—CaO—$Na_2O$) glass or aluminosilicate ($SiO_2$—$Al_2O_3$—$Na_2O$) glass. The amounts of Na and Fe may be adjusted depending on the application. Here, the term, "transparent" means that transmittance is preferably 70% or more.

The dopant is added in order to improve the electrical characteristics of ZnO. The dopant may be one or a combination of at least two selected from among, but not limited to, gallium (Ga), aluminium (Al), boron (B), indium (In), silicon (Si) and titanium (Ti). It is preferred that the amount of the dopant added to the ZnO thin film layer range from $1 \times 10^{18}/cm^3$ to $5 \times 10^{22}/cm^3$. In addition, it is preferred that the dopant is added in an amount ranging from 0.1 wt % to 0.5 wt %.

Figure 1:
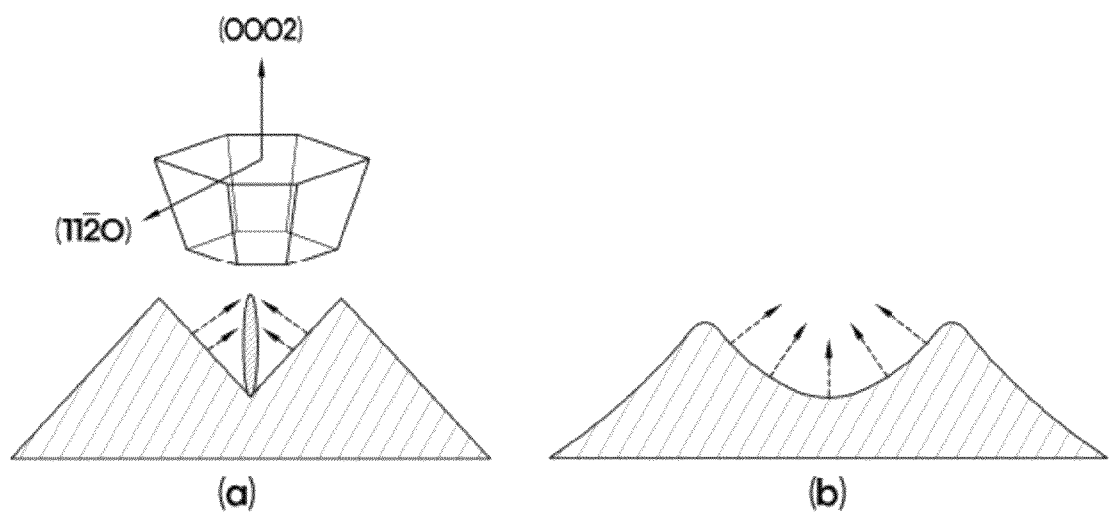
FIG. 1 is a schematic view comparatively depicting statuses before and after etching in order to explain the surface control mechanism on a zinc oxide (ZnO) thin film layer due to the etching using hydrogen plasma according to an embodiment of the invention.
Figure 2:
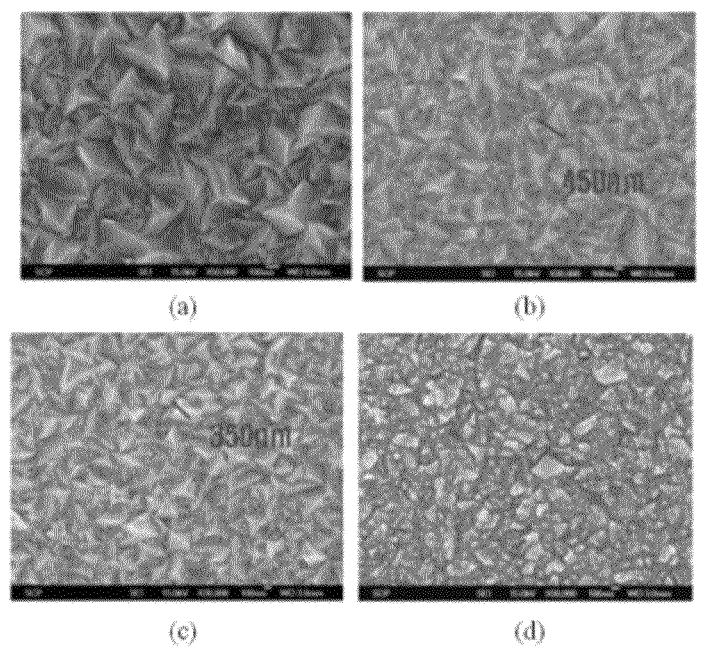
FIG. 2 is pictures of ZnO thin films taken based on variation in the intensity of hydrogen plasma according to an embodiment of the invention.

As shown in FIG. 1 (a) and FIG. 2 (a), the ZnO thin film layer formed by the CVD forms sharp V-shaped grooves (only one is shown) in the surface thereof. If a light-absorbing layer, for example, amorphous Si, is grown on the ZnO thin film layer having the V-shaped groove structure, the amorphous Si is grown symmetrically in the central portion of the V-shaped groove, so that the crystal growth planes of the amorphous Si eventually collide in the central portion of the groove, thereby creating defects. Therefore, in the method according to an embodiment of the invention, the ZnO thin film layer is subjected to hydrogen plasma etching in order to prevent this problem.

Thus, the step of controlling the surface structure of the ZnO thin film layer, which is carried out after the step of forming the ZnO thin film layer, is the step of controlling the surface structure of the ZnO thin film layer by etching it using hydrogen plasma. As shown in FIG. 1 (b), this step converts the V-shaped groove structure in the surface of the ZnO thin film layer into a U-shaped groove structure by the hydrogen plasma etching, thereby suppressing the collision between the crystal growth planes of the amorphous Si and preventing defects from occurring. Here, the hydrogen plasma selectively etches the (11-20) plane of the ZnO, thereby smoothing the surface of the ZnO. The hydrogen plasma etching can be carried out at a temperature ranging from room temperature to 300° C. for a period ranging from 1 to 30 minutes.

Here, the hydrogen plasma etching on the ZnO thin film layer may be carried out right after the formation of the ZnO thin film layer, either in the same chamber in which the ZnO thin film layer was formed or in a separate processing chamber, or may be carried out in a processing chamber in which the light-absorbing layer is to be deposited, before the deposition of the light-absorbing layer.

It is preferred that the pressure in the processing chamber in which the hydrogen plasma etching is conducted be maintained at $1 \times 10^{-4}$ torr or less. The hydrogen plasma is produced by the flow of hydrogen gas, which is blown into the processing chamber, and radio-frequency (RF) power. Here, the intensity of hydrogen plasma may be controlled by the RF power that is applied in the range from 10 W to 800 W.

In this hydrogen plasma etching, the ZnO thin film layer may be doped with hydrogen ion ($H^+$). In addition, during the hydrogen plasma etching, a hydrogen passivation film may be formed on the ZnO thin film layer.

When the step of controlling the surface structure is finished, the substrate for the photovoltaic cell according to an embodiment of the invention is manufactured. Thus, the substrate for the photovoltaic cell includes the transparent substrate and the dopant-doped ZnO thin film layer formed on the transparent substrate. In the resultant ZnO thin film layer, the (11-20) plane is selectively etched by the hydrogen plasma. The ZnO thin film layer is doped with hydrogen due to the hydrogen plasma etching, and has the hydrogen passivation film formed on the surface thereof.

With reference to the figures, a description will be given below of changes in the properties of the ZnO thin film layer based on the intensity of hydrogen plasma according to an embodiment of the invention.

First, FIG. 2 is pictures of ZnO thin films based on variation in the intensity of hydrogen plasma, taken using an electron microscope. In FIG. 2, part (a) is a picture that shows the surface structure of the ZnO thin film layer before being etched by hydrogen plasma. In FIG. 2 (a), the crystal particles are relatively coarse, and the average particle size is 600 nm. In addition, it can be appreciated that sharp V-shaped grooves are formed throughout the surface. FIG. 2 (b) to (d) are pictures showing the surface structures of the ZnO thin film layers after being etched by hydrogen plasma by applying different intensities of RF power. FIG. 2 (b) is a picture in which the RF power was 100 W, FIG. 2 (c) is a picture in which the RF power was 200 W, and FIG. 3 (d) is a picture in which the RF power was 500 W. It can be appreciated that the size of the crystal particles decreases and the surface structures are converted more smoothly with increasing intensity of the hydrogen plasma.

Figure 3:
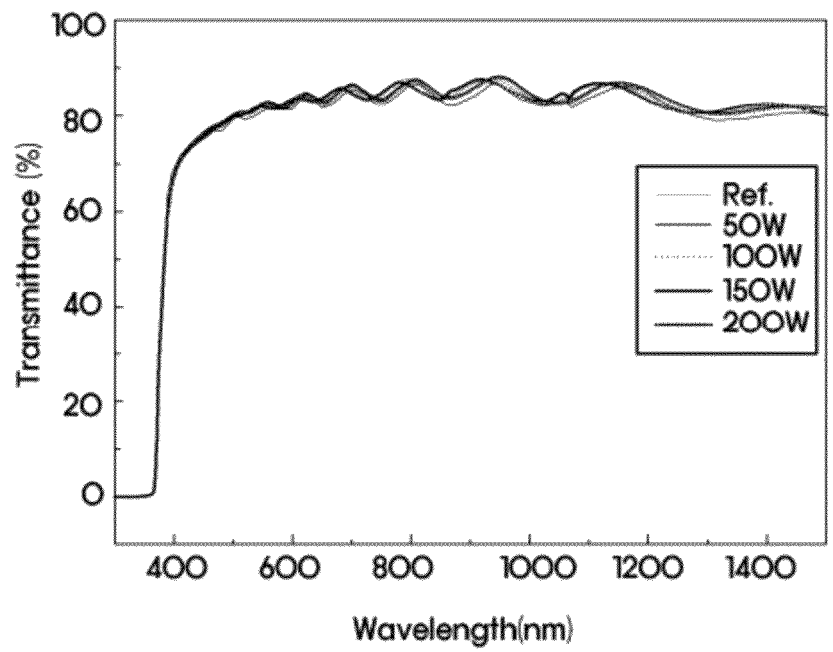
FIG. 3 is a graph depicting variation in the transmittance of ZnO thin film layers based on variation in the intensity of hydrogen plasma according to an embodiment of the invention.

FIG. 3 is a graph depicting variation in the transmittance of ZnO thin film layers based on variation in the intensity of hydrogen plasma. It can be appreciated that the transmittance is not significantly influenced when the intensity of the hydrogen plasma is changed. It is determined that the transmittance remains constant when the surface structure of the ZnO is changed using the hydrogen plasma.

Figure 4:
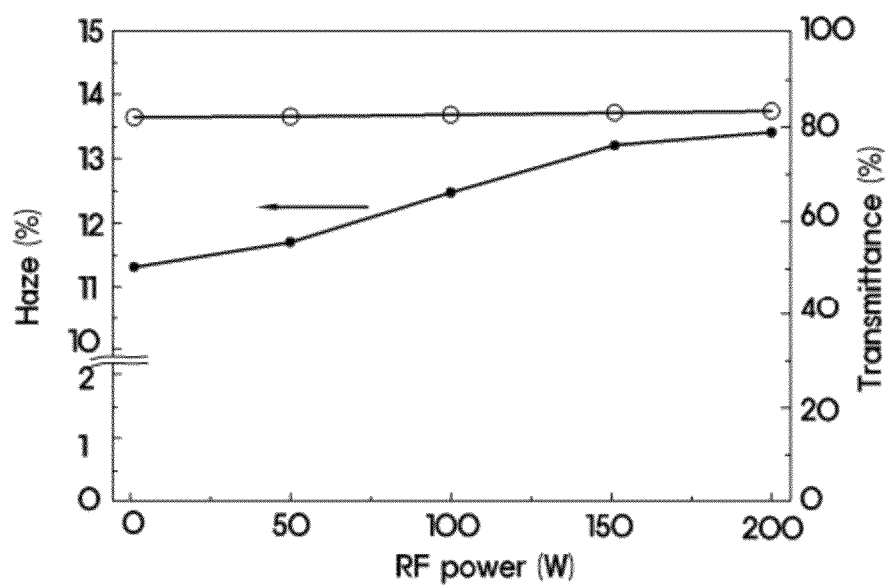
FIG. 4 is a graph depicting variation in the amount of hazing of ZnO thin film layers based on variation in the intensity of hydrogen plasma according to an embodiment of the invention.

FIG. 4 is a graph depicting variation in the amount of hazing of ZnO thin film layers based on variation in the intensity of hydrogen plasma. It can be appreciated that, when the hydrogen plasma etching according to an embodiment of the invention is carried out, the size of crystal particles decreases with increasing intensity of the hydrogen plasma, and the surface structure of ZnO is converted into a smoother shape. In addition, as the particle size is decreased, the value of hazing is increased from 11.3%, before the hydrogen plasma etching, to 13.5%, after the application of 200 W of RF power. The value of hazing and the transmittance are generally in a trade-off relationship with each other. It can be determined, however, that the transmittance remains constant irrespective of the changing values of hazing according to this embodiment.

Figure 5:
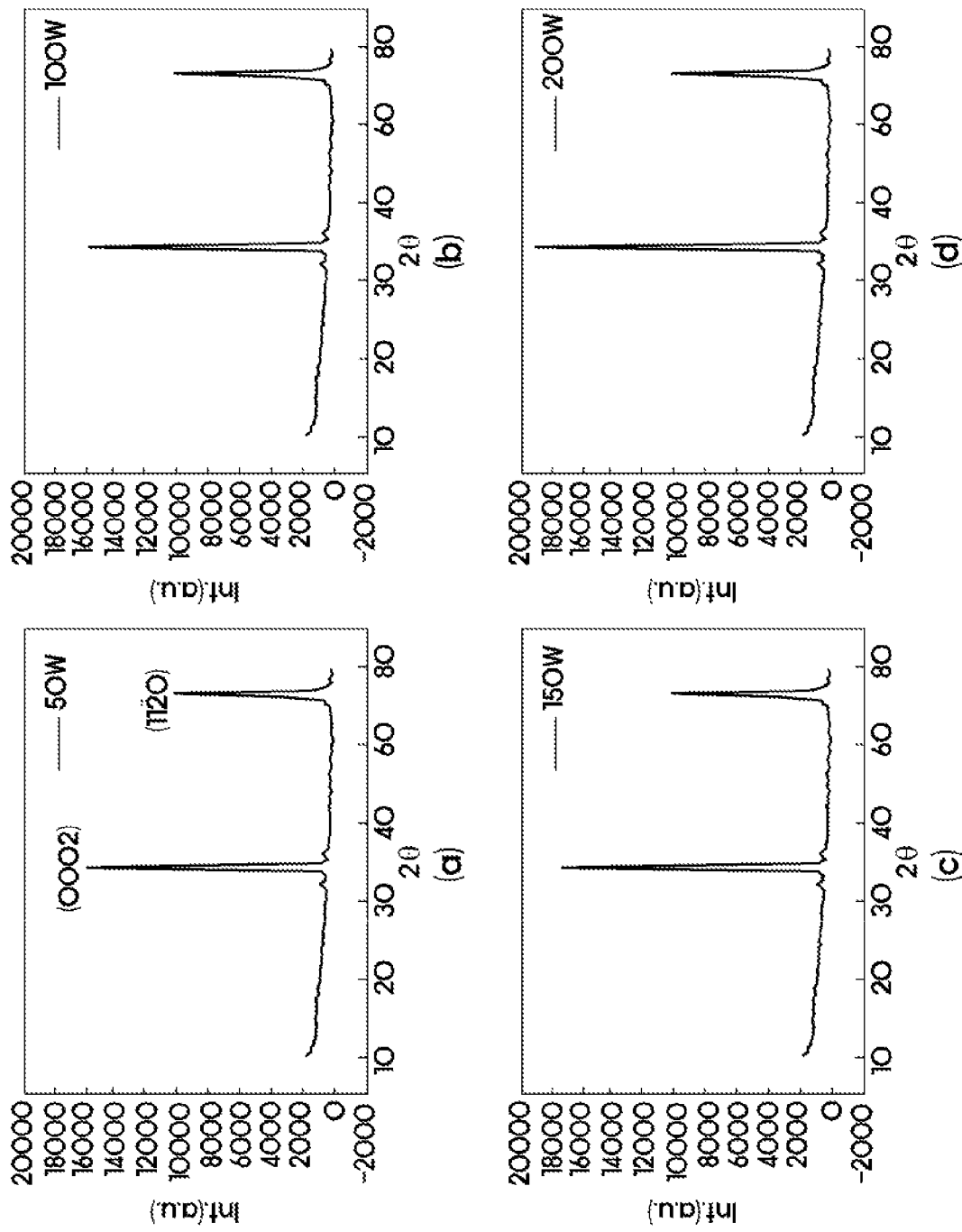
FIG. 5 is graphs depicting the results of XRD measurement on ZnO thin film layers based on variation in the intensity of hydrogen plasma according to an embodiment of the invention.

FIG. 5 is graphs depicting the results of XRD measurement on ZnO thin film layers based on variation in the intensity of hydrogen plasma. Based on these results, changes in the crystallinity of the ZnO thin film layers can be appreciated. As shown in FIG. 5, it can be appreciated that the intensity of the (11-20) decreases with increasing intensity of the hydrogen plasma, that the intensity of the (0002) plane is relatively increased, and that the ratio of the intensity of the (11-20) plane to the (0002) plane is decreased to approximately 43%. Therefore, it can be determined that the hydrogen plasma selectively etches the (11-20) plane. Due to the selective hydrogen plasma etching, the surface structure of the ZnO thin film layer is smoothly controlled.

Figure 6:
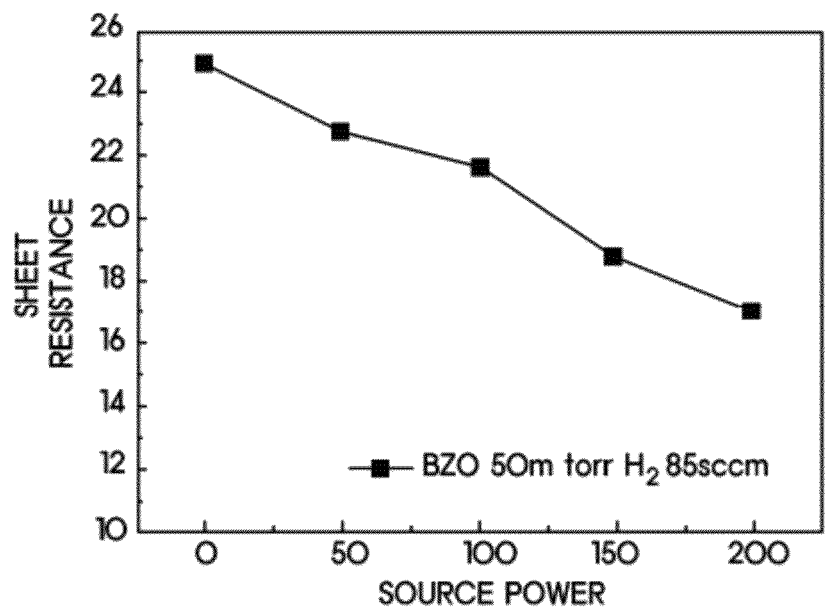
FIG. 6 is a graph depicting variation in the sheet resistance of ZnO thin film layers based on variation in the intensity of hydrogen plasma according to an embodiment of the invention.
Figure 7:
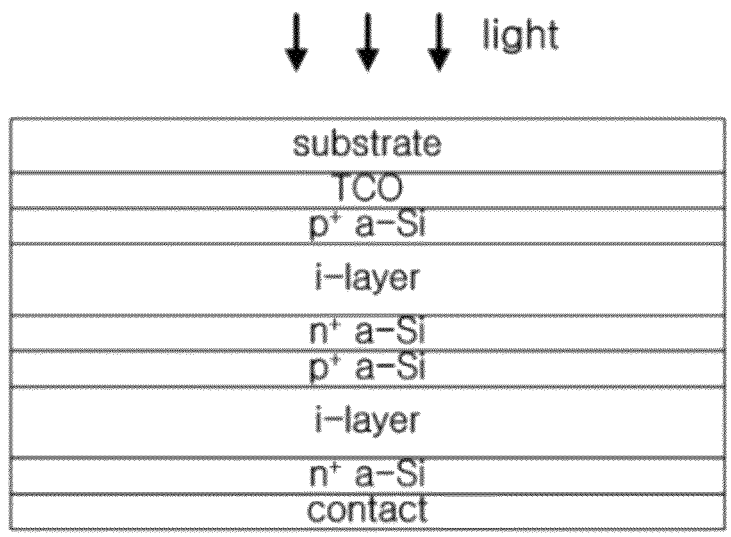
FIG. 7 shows a photovoltaic cell.

FIG. 6 is a graph depicting variation in the sheet resistance of ZnO thin film layers based on variation in the intensity of hydrogen plasma. It can be appreciated that the sheet resistance decreases with increasing intensity of the hydrogen plasma.

When the ZnO thin film layer is etched using the hydrogen plasma, the surface structure is smoothed. This can consequently suppress defects from occurring in amorphous Si, which will be deposited in subsequent processing, increase the value of hazing without having to decrease light transmittance, and decrease the sheet resistance. Accordingly, the efficiency of the photovoltaic cell to which the substrate is applied can be increased.

The foregoing descriptions of specific exemplary embodiments of the present invention have been presented with respect to the certain embodiments and drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. A method of manufacturing a substrate for a photovoltaic cell, comprising:

forming a zinc oxide thin film layer doped with a dopant on a transparent substrate; and controlling a surface structure of the zinc oxide thin film layer by etching the zinc oxide thin film layer using hydrogen plasma having an intensity, wherein the hydrogen plasma selectively etches a (11-20) plane of the zinc oxide thin film layer, and wherein the intensity of the hydrogen plasma is adjusted by application of radio-frequency power in a range from 10 W to 800 W.

2. The method of claim 1, wherein the etching the zinc oxide thin film layer using the hydrogen plasma is carried out at a temperature ranging from room temperature to 300° C. for 1 to 30 minutes.

3. The method of claim 1, wherein the hydrogen plasma makes the zinc oxide thin film layer doped with hydrogen.

4. The method of claim 1, wherein the hydrogen plasma makes a hydrogen passivation film formed on the zinc oxide thin film layer.

5. The method of claim 1, wherein the zinc oxide thin film layer is formed by chemical vapor deposition.

6. The method of claim 1, wherein the dopant comprises at least one selected from a group of candidate substances consisting of gallium, aluminum, boron, indium, silicon and titanium.

7. The method of claim 5, wherein the dopant is added in an amount ranging from $1\times10^{18}/cm^3$ to $5\times10^{22}/cm^3$.

8. The method of claim 5, wherein the dopant is added in an amount of 0.1~0.5 wt %.

9. The method of claim 1, wherein the controlling the surface structure of the zinc oxide thin film layer is carried out in a vacuum chamber, wherein a pressure in the vacuum chamber is maintained at $1\times10^{-4}$ torr or less.

10. The method of claim 1, further comprising, after the controlling the surface structure of the zinc oxide thin film layer is completed, forming a light-absorbing layer on the zinc oxide thin film layer.

* * * * *